United States Patent [19]

Blumenfeld

[11] 4,373,254

[45] Feb. 15, 1983

[54] METHOD OF FABRICATING BURIED CONTACTS

[75] Inventor: Martin A. Blumenfeld, Tequesta, Fla.

[73] Assignee: RCA Corporation, New York, N.Y.

[21] Appl. No.: 251,075

[22] Filed: Apr. 6, 1981

[51] Int. Cl.³ .......................................... H01L 21/26
[52] U.S. Cl. ...................................... 29/578; 29/571; 29/591; 29/576 B; 148/187
[58] Field of Search ................. 148/1.5, 187; 29/571, 29/578, 591, 576 B; 357/23 TF, 59

[56] References Cited

U.S. PATENT DOCUMENTS

| | | | |
|---|---|---|---|
| 4,196,443 | 4/1980 | Dingwall | 357/68 |
| 4,225,875 | 9/1980 | Ipri | 357/23 TF |
| 4,232,327 | 11/1980 | Hsu | 357/23 TF |
| 4,236,167 | 11/1980 | Woods | 357/23 TF |
| 4,263,057 | 4/1981 | Ipri | 357/23 TF |

*Primary Examiner*—G. Ozaki
*Attorney, Agent, or Firm*—Birgit E. Morris; Donald S. Cohen; Lawrence P. Benjamin

[57] ABSTRACT

A novel method for forming a buried contact wherein the area of the buried contact is preconditioned by being doped to thus preclude the formation of an undesirable junction surrounding the buried contact.

6 Claims, 9 Drawing Figures

METHOD OF FABRICATING BURIED CONTACTS

BACKGROUND OF THE INVENTION

This invention relates to semiconductor processing and, more particularly, to a novel method for forming buried contacts in MOS devices.

In the past, the prior art utilized metal interconnects and contacts to connect doped semiconductor regions or to connect to the gate of an MOS integrated circuit. However, as the density of the integrated circuit devices on a given size chip increased, it was found that there could be a significant saving in space by eliminating the space consuming metal contacts and interconnects. Accordingly, the use of polycrystalline silicon interconnects and buried contacts became a viable solution for the space problem and the use of polycrystalline silicon interconnects is now widespread. However, this widespread use of polycrystalline silicon has brought about certain problems when these techniques were applied, for example, to a silicon-on-insulator device which device, by its very nature, has a thin silicon epitaxial layer deposited on an insulating substrate.

A "buried contact" may be defined as a contact scheme which provides a low resistance, direct, ohmic contact between two polycrystalline silicon (polysilicon) layers or between a polysilicon layer and either bulk silicon or a layer of epitaxially grown silicon with no appreciable penalty for either the misalignment or any undesirably formed junction at the point of connection. Despite the advantages of the use of polysilicon interconnects and buried contacts, there have, nevertheless, been certain technical problems which result from the fact that the silicon layer in an SOS device is only about 6,000 angstroms in thickness. In a recently issued patent to A.G.F. Dingwall, entitled "BURIED CONTACT CONFIGURATION FOR CMOS/SOS INTEGRATED CIRCUITS," U.S. Pat. No. 4,196,443 which issued on Apr. 1, 1980 and assigned to the same assignee as the subject application, there is described various buried contact opening configurations formed in the insulating layer overlying the layer of semiconductor material and through which the buried contact is made. The shape of the opening for the buried contact is designed to preclude the complete removal of the epitaxial silicon material in the event of a misalignment. In the event of a misalignment, the described opening will insure that there is sufficient contact and silicon to form a useful device. However, the above-mentioned patent does not eliminate the possibility of the inadvertent removal of portions of the epitaxial silicon body.

SUMMARY OF THE INVENTION

A novel process is described for forming a buried contact in an MOS device wherein the area chosen for the buried contact is preconditioned and the contact opening is made smaller without the penalty of forming an undesirable junction which would render the device inoperative.

DETAILED DESCRIPTION OF THE DRAWING

While the following exegesis will be presented in terms of using sapphire as an insulating substrate or carrier, I do not wish to be so limited. Those skilled in the art will readily recognize that when the expression "sapphire" or "silicon-on-sapphire" (SOS) appears, it is also meant to include the use of spinel or monocrystalline beryllium oxide as the substrate on which the device may be formed.

Figure 1:
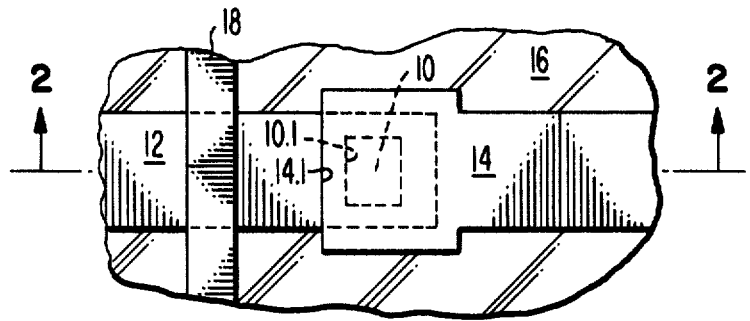
FIGS. 1 and 2 represent plan and elevational views, respectively, of one difficulty found in the prior art.
Figure 2:
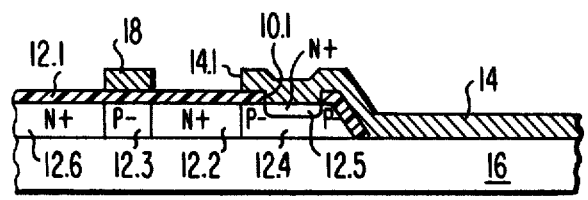

Referring now to FIGS. 1 and 2 there is shown and described one difficulty encountered by the prior art when, for example, either the contact opening is made too small or the contact pad is made too large. In any event, a misalignment of one edge of the contact pad with the corresponding edge of the contact opening results in an inoperative device by reason of the presence of an undesirably formed junction. For example, in the prior art, an island of epitaxial silicon 12 is grown or defined on sapphire substrate 16, the island consisting of channel region 12.3, source region 12.6 and drain region 12.2. The island 12 is covered with a thin layer of silicon oxide 12.1 in which contact opening 10 has been formed. If the masks used in the processing of this device were accurately aligned, outermost edge 14.1 of polysilicon layer 14 would be aligned with the innermost edge 10.1 of contact opening 10. However, as seen in FIG. 2, the outermost edge 14.1 of the polysilicon layer extends beyond the innermost edge 10.1 of opening 10 and, as a result, when source region 12.6 and drain region 12.2 are formed, for example, by ion implantation, a portion of the normally P doped island will be masked by that portion of polysilicon layer 14 that extends beyond edge 10.1. Thus, when the gate structure is subjected to an elevated temperature for the normal "drive in" step, N+contact region 12.5 is formed, which region will be surrounded by P—region 12.4. This junction formed by N+ region 12.5 and P—region 12.4 is undesirable in that a high bias is required to overcome the junction. In some instances, this may make the device inoperative.

Figure 3:
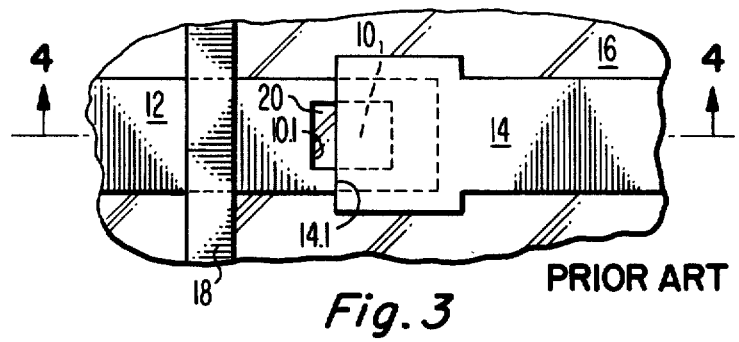
FIGS. 3 and 4 represent plan and elevationaal views, respectively, of another difficulty found in the prior art.
Figure 4:
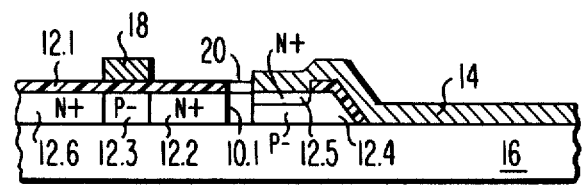

Referring now to FIGS. 3 and 4 for still another type of undesirable misalignment, there is shown a circumstance where interconnect 14 and contact opening 10 are misaligned to the extent that the outermost edge 14.1 of interconnect 14 does not cover the innermost edge 10.1 of contact opening 10. In this prior art embodiment, as in the embodiments of FIGS. 1 and 2, the normally P doped island 12 is initially formed and then provided with a thin oxide layer 12.1. After contact opening 10 is formed in oxide layer 12.1, the structure is provided with a layer of polysilicon 14 which layer is thereafter provided with a layer of masking material (not shown). The layer of masking material defines the limits and configuration of interconnect 14 and gate member 18. If the outermost edge 14.1 of interconnect 14 is not accurately aligned with the innermost edge 10.1 of contact opening 10, the net result will be the etching through of island 12 to form the etched-out or aperture portion 20. The reason for the formation of aperture 20 stems from the fact that the same etchant used to etch polysilicon layer 14 will also etch epitaxial silicon island 12. Thus, there is produced a device that may be inoperative due to the junction formed around region 12.5. At best, high bias is needed to overcome the resistance to current flow caused by the presence of the junction. Additionally, there would be a discontinuity in the source-drain current path due to the presence of aperture 20.

Referring now to FIGS. 5–9 for my improved method of fabricating buried contacts, it will be seen that island 12 may be formed in any manner well known in the art. After the formation of island 12, it is preferably doped and, in this instance, is shown doped with P— type conductivity modifiers in order to form an N channel device. Thereafter, the island is provided with a thin layer of gate oxide 12.1. The formation of the island and the formation of the gate oxide thereon being so well known in the art, no further explanation is required.

Figure 5:
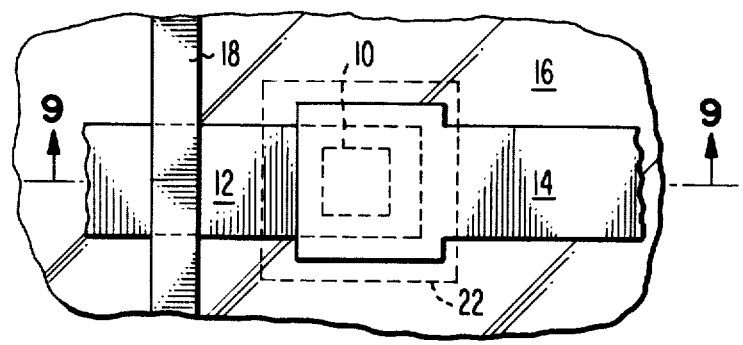
FIG. 5 and FIGS. 6–9 represent plan and elevational views, respectively, of the novel process of the subject invention indicating the various stages of my novel process.
Figure 6:
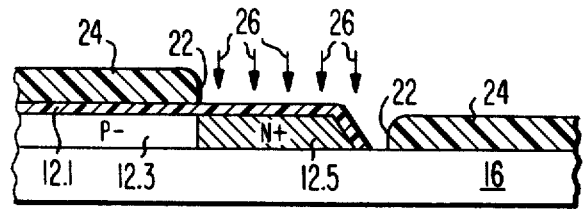

Referring specifically to FIGS. 5 and 6, there is shown island 12 provided with a patterned layer of photoresist 24, the dimensions of which are defined by edges 22. Thereafter, the exposed region of island 12 has N+conductivity modifiers ion implanted therein, as shown by arrows 26, in order to form a preconditioned region 12.5 in island 12. It should be understood that the preconditioned region 12.5 is large enough to accommodate any buried contact therein and includes any possible misalignment as previously described with reference to FIGS. 1 through 4.

Figure 7:
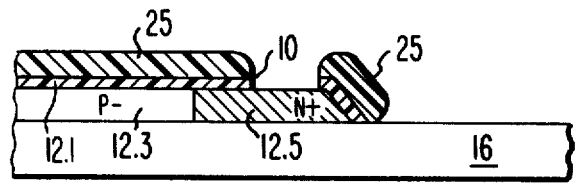
Figure 8:
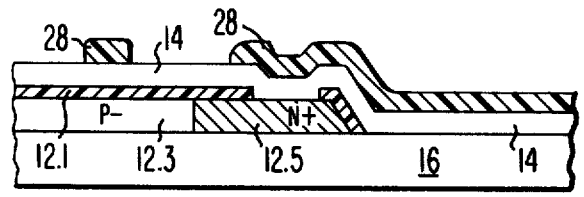

Referring now to FIG. 7, it will be seen that after the formation of the preconditioned region 12.5, photoresist material 24 is removed and island 12.1 is provided with still another layer of patterned photoresist 25 in order to form contact opening 10. After suitably etching the silicon dioxide layer 12.1 and forming the opening 10, photoresist 25 is removed and doped polysilicon layer 14 is formed over the entire surface of both the island and the sapphire, as shown in FIG. 8. Thereafter, the structure is provided with still another layer of patterned photoresist 28 in order to define the limits of the interconnect as well as the gate. This is followed by a second etch to remove the undesired portions of polysilicon layer 14. Further, in order to avoid any possible etching of island 12, the configuration of the polysilicon interconnect is so configured as to extend beyond the contact opening toward the gate member. As will be seen, this will have no deleterious effect.

Figure 9:
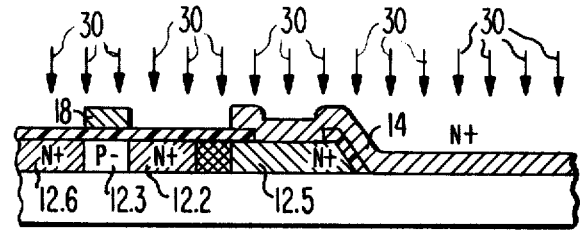

Thereafter, as shown in FIG. 9, the entire structure is subjected to another ion implantation step (with N+type conductivity modifiers, as shown by arrows 30) in order to form source region 12.6, drain region 12.2 and to further dope gate line 18 and polysilicon interconnect/contact 14. However, in this instance, despite the fact that the outermost edge of interconnect 14 extends beyond the contact region, there is no intervening undesired junction due to the fact that region 12.5 has been previously preconditioned.

Similarly, should the outermost of interconnect 14 fall short of the innermost edge of the contact opening as depicted in the prior art embodiment of FIGS. 3 and 4, a completely operative and satisfactory low resistance contact will be formed despite the fact that there may be an aperture therein (similar to aperture 20 as shown in FIGS. 3 and 4). However, no undesirable junction will be formed due to the prior preconditioning of island 12 in the region of the drain.

While the foregoing explanation was presented in terms of both the device and process for forming a silicon-on-sapphire device, it should now be obvious to those skilled in the art that a similar process and resulting device may be formed in bulk silicon without departing from the inventive concept.

Further, while I have described a process for forming a single buried contact on an N channel device, it should also be obvious to those skilled in the art that both the source and drain may be formed simultaneously on either an N channel or a P channel device using the principles of my invention as previously set forth.

Accordingly, the device made in accordance with the above process forms a buried contact and precludes the formation of undesirable junctions by reason of the preconditioning of the area surrounding the buried contact.

What I claim is:

1. A process for forming low resistance, ohmic contacts to a semiconductor body of a given conductivity type, the body having a layer of insulating material thereon, comprising the steps of:
    masking the semiconductor body to delineate an area within which the ohmic contact is to be formed, the delineated area being larger than the area of the ohmic contact;
    doping only the delineated area of the semiconductor body under the delineated area to an opposite conductivity type;
    removing a portion of the layer of insulating material in the delineated area to expose a portion of the underlying semiconductor body; and
    providing a conductive ohmic contact to the exposed portion of the semiconductor body.

2. The process of claim 1, wherein:
    the body of semiconductor material is an island of silicon epitaxially grown on an insulating substrate.

3. The process of claim 2, wherein the insulating substrate is selected from the group consisting of sapphire, monocrystalline beryllium oxide and spinel.

4. A process for forming a semiconductor device having low resistance ohmic contacts to active regions in a semiconductor body comprising the steps of:
    forming a semiconductor body of a given conductivity type;
    forming an insulating layer on the surface of the semiconductor body;
    masking the semiconductor body to delineate areas within which the ohmic contacts are to be formed, each delineated area being larger than the respective area of the ohmic contact to be formed therein;
    doping the delineated area to an opposite conductivity type;
    removing a portion of the insulating layer, within each delineated area, to expose an area of the surface of the semiconductor body to which ohmic contact may be made;
    providing a patterned layer of conductive material to define contact members on the contact areas and gate members; and
    implanting conductivity modifiers into the body of semiconductor material to produce opposite conductivity type active regions, the patterned layer of conductive material constituting a mask for defining the active regions.

5. The process of claim 4, wherein:
    the body of semiconductor material is an island of silicon epitaxially grown on an insulating substrate.

6. The process of claim 5, wherein the insulating substrate is selected from the group consisting of sapphire, monocrystalline berryllium oxide and spinel.

* * * * *